United States Patent
Fried et al.

(10) Patent No.: US 7,052,958 B1
(45) Date of Patent: May 30, 2006

(54) FINFET CMOS WITH NVRAM CAPABILITY

(75) Inventors: David M. Fried, Ithaca, NY (US); Chung Hon Lam, Williston, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 246 days.

(21) Appl. No.: 10/675,625

(22) Filed: Sep. 30, 2003

Related U.S. Application Data (62) Division of application No. 10/063,095, filed on Mar. 19, 2002, now Pat. No. 6,657,252.

(51) Int. Cl.
*H01L 21/336* (2006.01)

(52) U.S. Cl. .................................................. 438/257

(58) Field of Classification Search ........ 257/314–324; 438/257–265
See application file for complete search history.

(56) References Cited

U.S. PATENT DOCUMENTS

| | | | |
|---|---|---|---|
| 5,041,886 A | 8/1991 | Lee | |
| 5,256,584 A | 10/1993 | Hartmann | |
| 5,455,792 A | 10/1995 | Yi | |
| 5,468,663 A | 11/1995 | Bertin et al. | |
| 5,739,567 A | 4/1998 | Wong | |
| 6,033,957 A | 3/2000 | Burns, Jr. et al. | |
| 6,040,218 A | 3/2000 | Lam | |
| 6,107,141 A | 8/2000 | Hsu et al. | |
| 6,108,239 A | 8/2000 | Sekariapuram et al. | |
| 6,114,725 A | 9/2000 | Furukawa et al. | |
| 6,133,098 A | 10/2000 | Ogura et al. | |
| 6,143,636 A | 11/2000 | Forbes et al. | |
| 6,157,061 A | 12/2000 | Kawata | |
| 6,174,771 B1 | 1/2001 | Leu | |
| 6,198,125 B1 | 3/2001 | Yamazaki et al. | |
| 6,303,960 B1 * | 10/2001 | Wang | 257/316 |

FOREIGN PATENT DOCUMENTS

JP   408162547 A   6/1996

* cited by examiner

*Primary Examiner*—Cuong Nguyen
(74) *Attorney, Agent, or Firm*—William D. Sabo (57) ABSTRACT

The present invention provides a device design and method for forming the same that results in Fin Field Effect Transistors having Non-Volatile Random Access Memory (NVRAM) capability. NVRAM capability arises from the presence of double floating gates arranged on and insulated from a semiconductor fin body, and a control gate arranged on and insulated from the double floating gates. The fabrication of the present device may be accomplished by: providing an SOI wafer and defining a fin on the SOI wafer, the fin may be capped with an insulator layer; providing gate insulator on at least one vertical surface of the FIN; depositing floating gate material over the gate insulator; depositing insulator material on the floating gate material to form the floating gate isolation; depositing control gate material over the isolated floating gate material; removing a portion of the control gate material to expose source and drain regions of the Fin, implanting the Fin to form source/drain regions in the exposed regions of the Fin, and providing insulator material on the Fin. In addition, the NVRAM FinFET allows for horizontal current flow.

9 Claims, 7 Drawing Sheets

FINFET CMOS WITH NVRAM CAPABILITY

REFERENCE TO RELATED APPLICATION

This application is a divisional of application Ser. No. 10/063,095, filed Mar. 19, 2002, now issued as U.S. Pat. No. 6,657,252.

BACKGROUND OF THE INVENTION

Technical Field

The present invention relates generally to the field of semiconductor manufacturing and, more specifically, to a FinFET CMOS device and method for fabricating a FinFET CMOS device with NVRAM capability.

The need to remain cost and performance competitive in the production of semiconductor devices has caused continually increasing device density in integrated circuits. To facilitate the increase in device density, new technologies are constantly needed to allow the feature size of these semiconductor devices to be reduced.

Data is stored in memory. In general, memory can be Read Only Memory (ROM) or RAM, Random Access Memory. Most RAMs, including DRAM and SRAM, are volatile. That is, when power is removed, the data contained in the DRAM or SRAM cells are lost. Non-Volatile Random Access Memory or NVRAM is memory which retains its data contents despite power failure. Examples of NVRAM include FLASH, electrically erasable reprogrammable read-only memory or EEPROM and electrically programmable read-only memory or EPROM.

NVRAM has been accomplished by the incorporation of a floating gate structure into the transistors of memory devices. Floating gates are comprised of conductive material which is electrically insulated from surrounding structures. A floating gate may be placed between gate insulator material and a second gate where the second gate may be a control gate. Floating gates can be charged using tunneling techniques (sometimes referred to as Fowler-Nordheim tunneling) where a large voltage is applied between the control gate and the substrate resulting in a charge accumulating in the floating gate, or another technique well known in the art, hot-electron programming. Once the floating gate has been charged, because the floating gate is electrically isolated in the circuit, that charge remains intact without the requirement of being refreshed. The level of charge accumulation in floating gate structures can be carefully controlled. Floating gate structures have been used to implement neural-network-type hardware.

Previously, the incorporation of floating gate structures into the transistors of memory devices has been accomplished using traditional semiconductor fabrication techniques to build traditional FET structures. However, the need to remain cost and performance competitive requires that these floating gate structures be incorporated into semiconductor devices in higher densities to allow for the reduction in size of semiconductor devices. Thus, there is a need for improved device structures and methods of fabrications of floating gates that provide NVRAM capability in smaller devices.

BRIEF SUMMARY OF THE INVENTION

It is thus an object of the present invention to provide NVRAM capability for high density semiconductor devices.

In one aspect, the present invention an NVRAM comprises the steps of providing an SOI wafer and defining a Fin on the SOI wafer; providing gate insulator on at least one vertical surface of the Fin; depositing floating gate material over the gate insulator; depositing insulator material on the floating gate material to form the floating gate isolation; depositing control gate material over the isolated floating gate material; removing a portion of the control gate material to expose source and drain regions of the Fin, and implanting to form source/drain regions in the exposed regions of the Fin.

In another aspect, the invention is an NVRAM device comprising a transistor body having two sides; a gate insulator on both of the sides of the transitor body; and first and second floating gates on said gate insulator and disposed on respective sides of said transistor body.

The foregoing and other advantages and features of the invention will be apparent from the following more particular description of an embodiment of the invention, as illustrated in the accompanying drawings.

BRIEF DESCRIPTION OF THE SEVERAL VIEWS OF THE DRAWINGS

Embodiments of the present invention will hereinafter be described in conjunction with the appended drawings, where like designations denote like elements, and.

DETAILED DESCRIPTION OF THE INVENTION

The present invention provides a device and method for combining NVRAM capability with a FinFET CMOS device. One method for increasing the density of CMOS devices is to build structures vertically, upward from the surface of the semiconductor wafer. For example, a fin, a silicon shape built on a silicon or Silicon On Insulator (SOI) substrate, extending vertically out of the plane of the substrate can be used to build FET structures. For example, the vertical sides of a fin can be utilized to form FETs. These FETs incorporated into fin structures are called FinFETs.

The present invention provides a device and method for providing NVRAM capability to a FinFET. Providing NVRAM floating gate structure to the vertical structure of FinFETs allows for the manufacture of semiconductor devices which are more compact and also provide NVRAM capability. Providing NVRAM capability reduces the energy requirements of the device. The FinFET as provided may be thin, to allow the FinFET to be fully depleted which reduces current leakage and reduces the energy requirements for the device. In addition, the present invention provides a device which allows for horizontal current flow, or current flow parallel to the surface of the semiconductor device. The embodiments of the present invention are applicable to any device in which high density NVRAM or FinFET NVRAM is desirable.

The present invention provides a FinFET structure covered by a layer of conductive floating gate material, which is in turn covered by a layer of insulator material, covered by conductive control gate material. The floating gate material is electrically insulated from the surrounding circuits and is therefore electrically insulated. Once charged, the floating gate is capable of maintaining its charge for extremely long periods of time, eliminating the need to continually refresh and recharge the device. This structure provides single or double FinFETs covered by single or double spacer-like floating gates, covered by a single or multiple control gates. The FinFET may be very thin to allow the FinFET to fully deplete during the operation of the semiconductor device. Multiple NVRAM FinFET structures can be incorporated into a larger semiconductor device.

Figure 1:
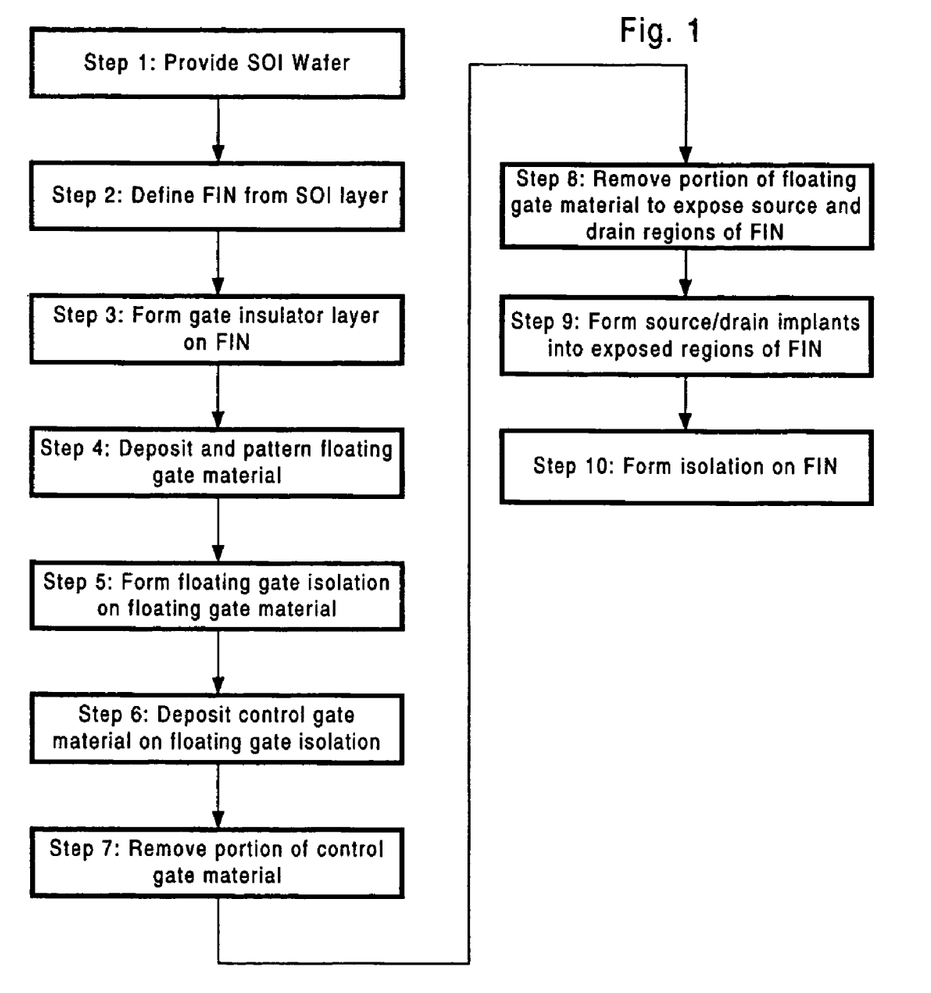
FIG. 1 is a flow diagram illustrating a fabrication method of an embodiment of the invention.

Turning now to the Figures, FIG. 1 is a flow chart illustrating a method for fabricating an embodiment of the present invention. Generally, the fabrication of the present device may be accomplished by: providing an SOI wafer and defining a fin on the SOI wafer, the fin may be capped with an insulator layer; providing gate insulator on at least one vertical surface of the fin; depositing floating gate material over the gate insulator; depositing insulator material on the floating gate material to form the floating gate isolation; depositing control gate material over the isolated floating gate material; removing a portion of the control gate material, removing the exposed portion of insulator above the floating gate material, and removing a portion of the floating gate material, to expose source and drain regions of the fin, and implanting to form source/drain regions in the exposed regions of the fin.

Those of ordinary skill in the art will recognize that the steps outlined in FIG. 1 are illustrative of one fabrication method which can be used to make an embodiment of the present invention. The steps in the flowchart are not exhaustive of the steps and the order of the steps which can be employed to make an embodiment of the present invention. It will also be understood that the invention is not limited to use of any specific dopant types provided that the dopant types selected for the various components are consistent with the intended electrical operation of the device.

Fabrication of an embodiment of the present device may begin with Step 1 of FIG. 1, providing a silicon-on-insulator (SOI) wafer. Buried insulator 99 may be formed on wafer 90 using thermal oxidation, such as rapid-thermal processing (RTP) or furnace processing for example, or other techniques known in the art. Buried insulator 99 may comprise any insulative material, such as buried oxide (BOX). However, any type and/or combination of buried insulators may be used for buried insulator 99. A layer of insulator or Box 99, with a patterned layer of silicon 100*a* on top are together the Silicon on Insulator (SOI) layer 104, as illustrated in FIG. 2.

Figure 2:
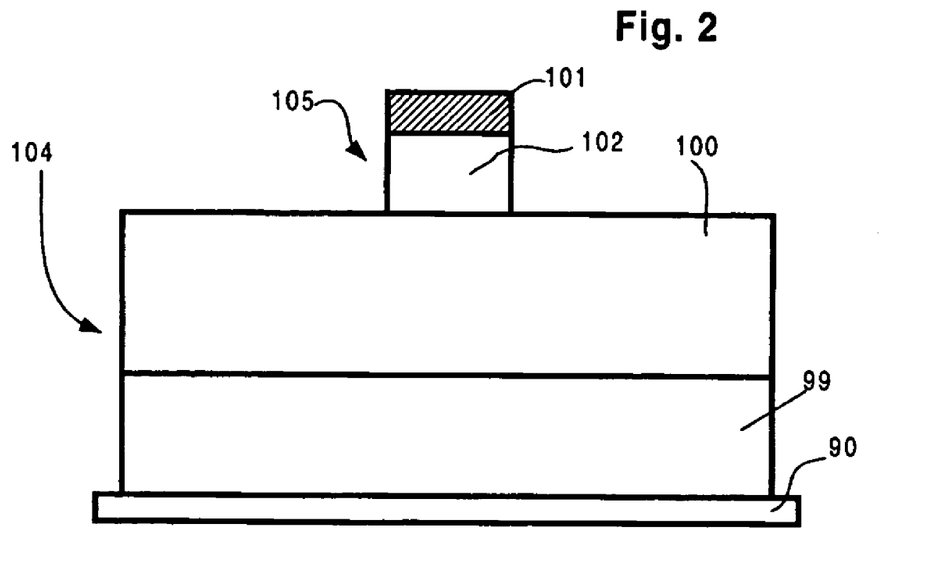
FIGS. 2–8 are schematic views of an embodiment of the invention during the fabrication method of FIG. 1.
Figure 3:
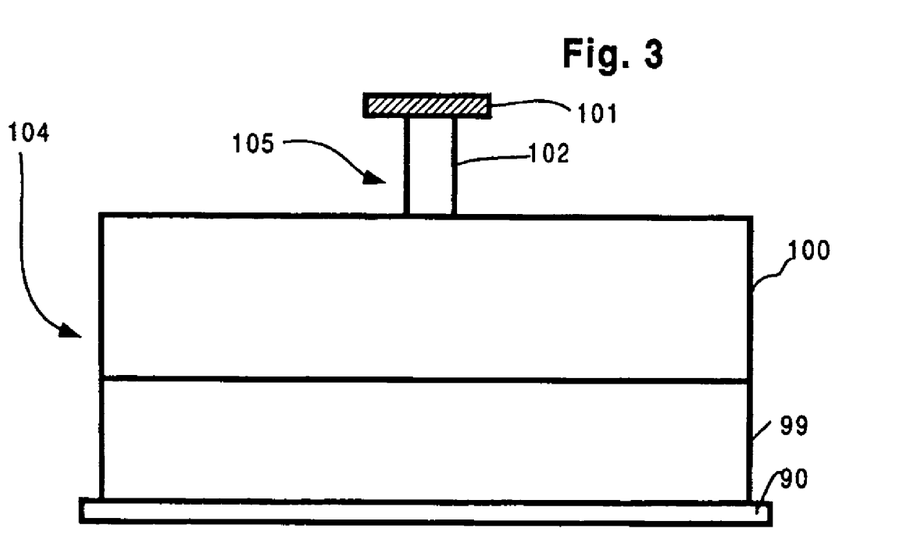

Referring to the substrate embodiment depicted in FIGS. 2 and 3, substrate or SOI layer 104 may comprise wafer 90 that underlies Box or buried insulator 99 that underlies semiconductor layer or silicon layer 100*a*. Therefore, for example, substrate or SOI layer 104 may comprise a single crystal silicon-on-insulator (SOI) wafer. However, other substrate 104 embodiments may be used, such as a non-SOI wafer comprising only wafer 90 for example. When a non-SOI wafer embodiment is used, the processing remains otherwise identical to that of a SOI wafer embodiment, except as noted.

Still referring to FIGS. 2 and 3, while wafer 90 is depicted as having a minimum of complexity, other wafers of varying complexity may be advantageously employed. Wafer 90 may be composed of any appropriate semiconducting material, including, but not limited to: Si, Ge, GaP, InAs, InP, SiGe, GaAs, or other III/V compounds. For the exemplary purposes of this disclosure, wafer 90 may comprise single crystal silicon.

Figure 4:
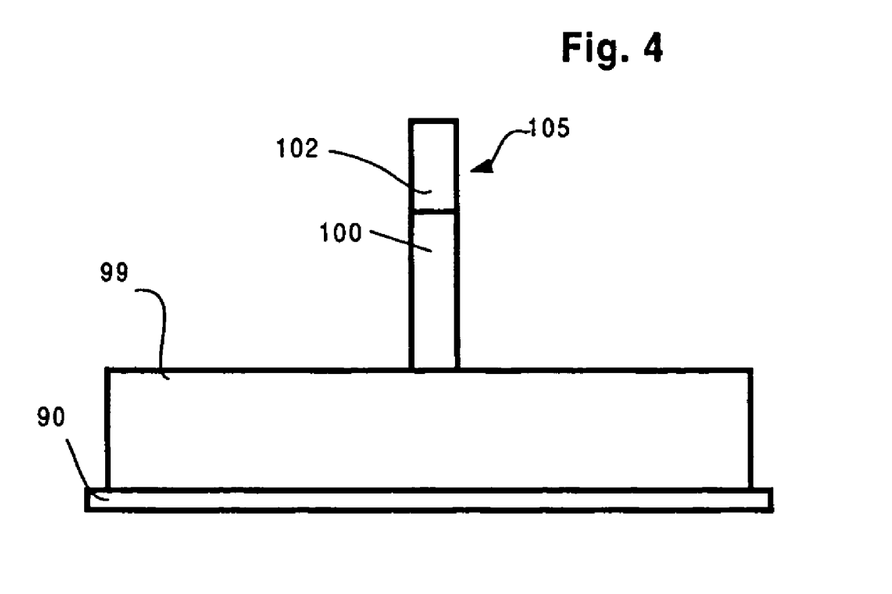

In step 2 of FIG. 1, a Fin stack 105 is defined from the SOI layer 104. FIGS. 2, 3, and 4 illustrate the device as Fin stack 105 is defined as in Step 2 of FIG. 1. In FIG. 2, an oxide shape 102 is formed on SOI layer 104. Oxide shape 102 may be formed lithographically or otherwise. For the exemplary purposes of this disclosure, a mask may be used to apply a layer of photoresist on silicon layer 100*a*. Photoresist can define the region where oxide shape 102 is desired. Oxide shape 102 may be composed of silicon dioxide ($SiO_2$) a nitrided oxide material, hard mask material, a combination thereof, or any other insulating, non-conductive, dielectric material. For the exemplary purposes of this disclosure, oxide shape 102 will be defined as hard mask material or silicon dioxide. Silicon dioxide can be provided in the desired region by thermal oxidation, typically at 750–800° C., or alternatively, may be formed by depositing a dielectric film. This film may be applied by any means well known to those of ordinary skill in the art. As illustrated in FIG. 2, oxide shape 102 may have a Cap 101. Cap 101 may be an insulator such as silicon dioxide ($SiO_2$) or silicon nitride ($Si_3N_4$). For the exemplary purposes of this disclosure, Cap 101 is hard mask material. Hard mask material may be applied to form Cap 101 by any means well known to those of ordinary skill in the art. As a next step, the photoresist layer can be removed, leaving Cap 101 on oxide shape 102 on SOI layer 104.

Oxide shape 102 may be selectively trimmed under Cap 101 by directional etching or by other means. FIG. 3 illustrates the device after this trimming step. In FIG. 3, oxide shape 102 under Cap 101 has been trimmed compared to oxide shape 102 of FIG. 2.

Fin stack 105 may be further defined to narrow the layer of silicon 100*a* which becomes the fin body 100. An etch step may be employed to remove cap 101 and to selectively remove silicon layer 100*a* to form fin body 100 under oxide shape 102. The device after such an etch step is illustrated in FIG. 4. FIG. 4 illustrates Fin stack 105 composed of fin body 100 on insulator 99 topped with trimmed oxide shape 102. A more narrow fin body 100 may be desirable because a more narrow fin body 100 may allow the FET channel which is formed in the fin body 100 to be fully depleted of majority carriers during the operation of the device. This full depletion avoids the so-called "floating body effect." The floating body effect is suffered by partially depleted SOI devices. The floating body effect occurs where the relatively slow charging of an undepleted (and hence electrically conductive) region of the FET body can be electrically charged to various voltages, depending on its most recent history of use. This floating body effect leads to a less reproducible behavior of the device and thus requires larger changes in stored charge in the floating gate to enable unambiguous detection of the charge state of the non-volatile storage device.

An additional step to remove any oxide or defect that might still remain on the fin may be carried out. This step may be a sacrificial oxidation. A sacrificial oxidation step may include growing a thin layer of silicon dioxide on the vertical sides 103 of Fin body 100.

In one embodiment, Fin stack 105, which is comprised of oxide shape 102 on fin body 100, may then be doped as needed. Typically, this may include an ion implantation of boron to dope silicon layer or fin body 100 to form N-type MOSFETs. However, P-type FETs may be desirable. In addition, if the gates are made of other materials such as metals, arsenic or phosphorus may be used to dope silicon layer or fin body 100. In addition, in the CMOS technology of the present invention, P-well structures and N-well structures may be formed to allow the integration of NFETs and PFETs in a common substrate. P, As and Sb, for example, are well suited for PFETs. B, In and Ga, for example, are well suited for NFETs. Fin body 100 may be doped to a concentration between $1 \times 10^{17}$ cm$^{-3}$ to $5 \times 10^{18}$ cm$^{-3}$ for example. In one embodiment, ion implantation may comprise an angled implant into exposed opposing vertical sidewalls 103 of semiconductor layer 100, and would serve to properly dope the fins. Alternatively, this implantation step may occur later in the fabrication process as described in Step 8 of FIG. 1. Or, some doping or implantation may occur at this point in the fabrication process and some doping or implantation may occur again later in the fabrication process as described in Step 8 of FIG. 1. This implantation may be followed by an etch of the sacrificial oxide layer. This etch step may employ a dilute hydrofluoric acid strip of that silicon dioxide layer to remove any silicon dioxide from the vertical side of Fin body 100.

Figure 5:
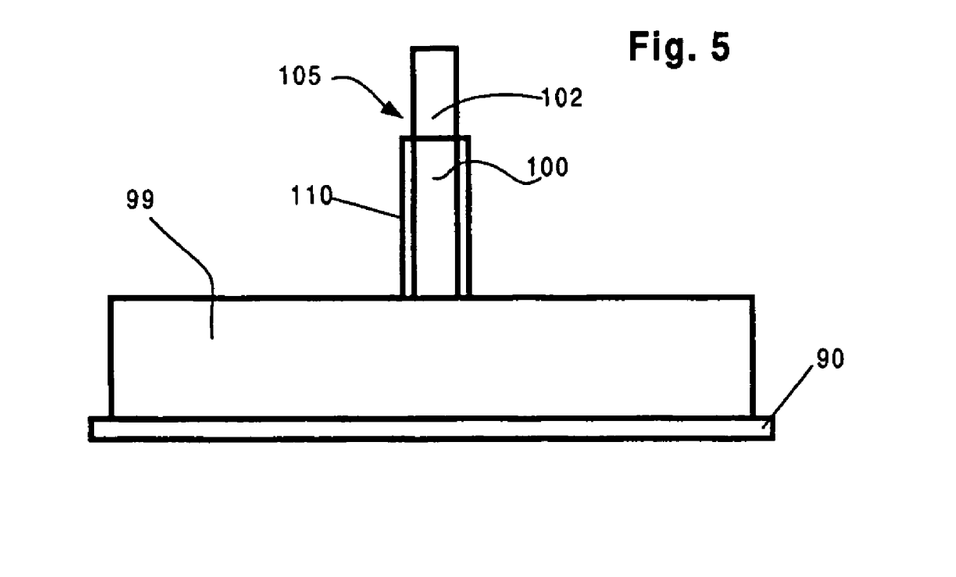

In step 3 of FIG. 1, a gate insulator or gate dielectric layer or gate insulator layer 110 is formed on the fin body sidewall or the vertical sides 103 of Fin body 100. FIG. 5 illustrates the device after the formation of a gate insulator layer 110 or gate stack along vertical sides 103 of Fin body 105. Gate insulator layers 110 may be formed by thermal oxidation, typically at 750–800° C., or alternatively, may be formed by depositing a dielectric film. For the exemplary purposes of this disclosure, gate insulator layers 110 may be deposited in an application of $SiO_2$, a nitrided oxide material, a high-K dielectric material, or combinations thereof, as known in the art. This film may be applied by other means well known to those of ordinary skill in the art. The gate dielectric layer 110 may be formed on both vertical sides even if only a single floating gate is desired, and this gate dielectric layer 110 could be useful as an etch-stop in later steps. Alternatively, the insulator may consist of a stack of insulators such as $Si_3N4$ with $HfO_2$, or other similar materials.

Figure 6:
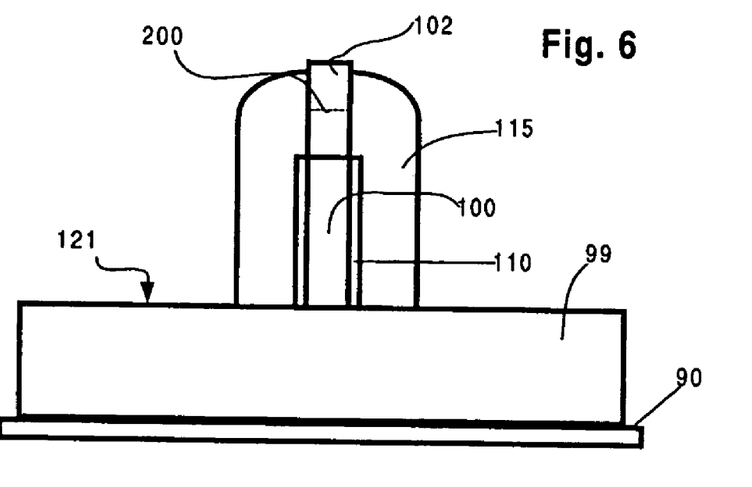

In step 4 of FIG. 1, polysilicon is deposited and patterned to form a floating gate 115. If a single floating gate 115 is desired, polysilicon or other conductive material can be deposited on one side of Fin stack 105. If a double floating gate 115 is desired, polysilicon can be deposited on both sides of Fin stack 105, as illustrated in FIG. 6. Floating gate 115 may be applied by means of conformal deposition of polysilicon followed by a directional etch. This technique is also used to create spacers. This technique can be termed "spacer etching" floating gate polysilicon to form a spacer floating gate. In this context, this technique results in a layer of polysilicon material on the vertical surface or surfaces 103 of Fin stack 105, but removes polysilicon material from the horizontal surfaces, including the horizontal surface 121 of Box 99. Floating gate 115 as illustrated in FIG. 6 resembles and may be described as a spacer. Alternatively, floating gate 115 may be defined by lithography, as is well known in the art.

Figure 7:
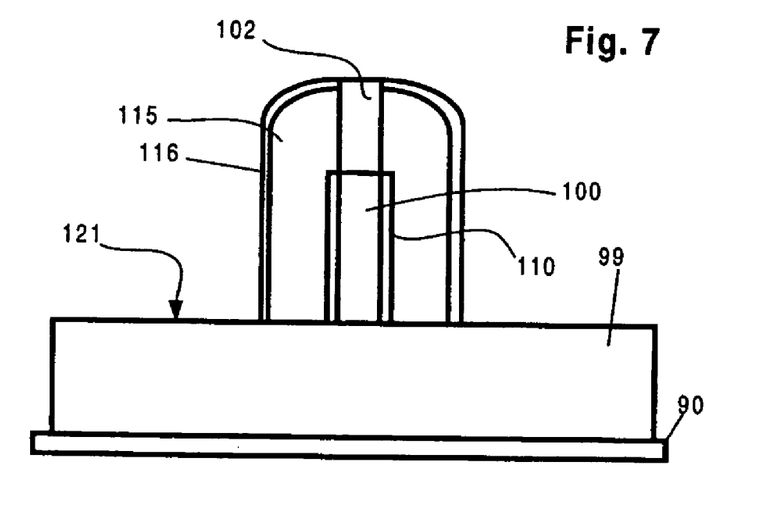

Step 5 of FIG. 1 is the formation of isolation 116 on the exterior side of floating gate 115. This isolation may be formed by the thermal oxidation, typically at 750–800° C., or alternatively, may be formed by depositing a dielectric film. This film may be applied by any means well known to those of ordinary skill in the art. Or, the isolation may be formed by a combination of $SiO_2$ and $Si3N4$, for example. FIG. 7 illustrates isolation 116 formed on floating gate 115.

Figure 8:
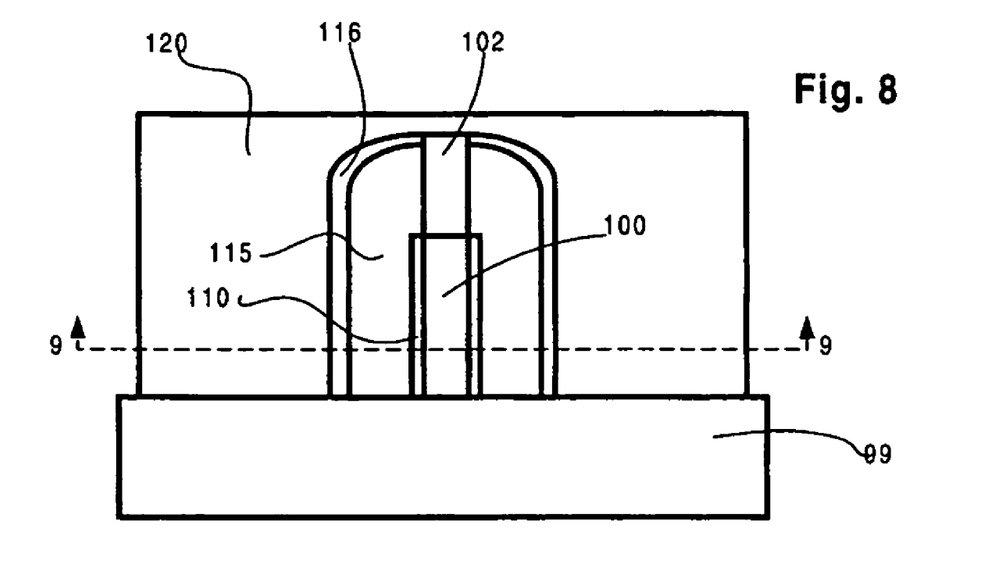
Figure 9:
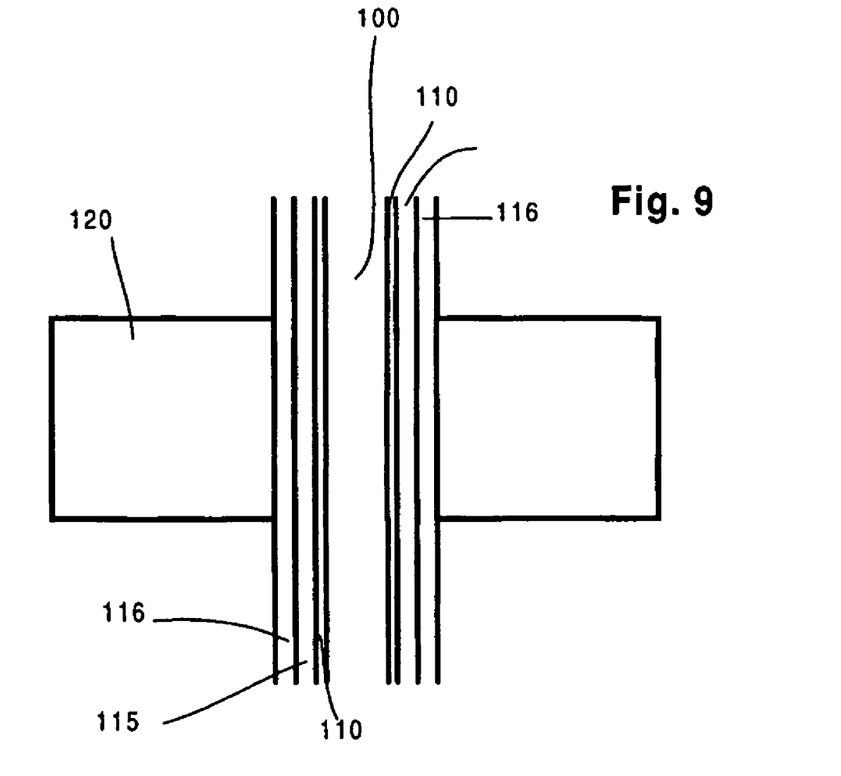
FIG. 9 is a cross-sectional view taken at line 9—9 of FIG. 8.

Step 6 of FIG. 1 is the deposition of control gate 120 material on the floating gate isolation 116. This step is illustrated in FIG. 8. The control gate 120 may be polysilicon and may be a global gate, connecting multiple devices across the semiconductor "chip." Control gate material 120, as illustrated in FIG. 8, may be applied as a blanket polysilicon layer over the entire Fin region. Unwanted control gate material may then be removed by a selective etch step, by lithography or otherwise, to form the desired control gate structure 120. FIG. 9 is a cross-sectional view of the semiconductor device of FIG. 8, taken at line 9—9 illustrating control gate 120 overlying floating gate isolation 116 floating gate 115, gate oxide 110 and fin body 100.

Figure 10:
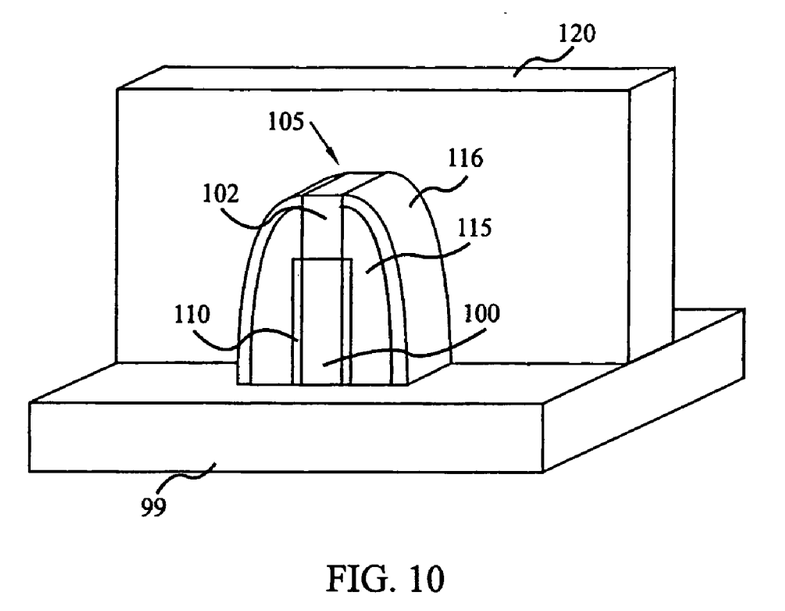
FIGS. 10 and 11 are perspective views of an embodiment of the invention during the fabrication method of FIG. 1.

FIG. 10 is a perspective view of the device after step 6 of FIG. 1. FIG. 10 illustrates control gate 120 overlying floating gate isolation 116 and oxide shape 102. Below floating gate isolation 116 is floating gate 115, gate oxide 110 and fin body 100. These structures rest on BOX 99.

Figure 11:
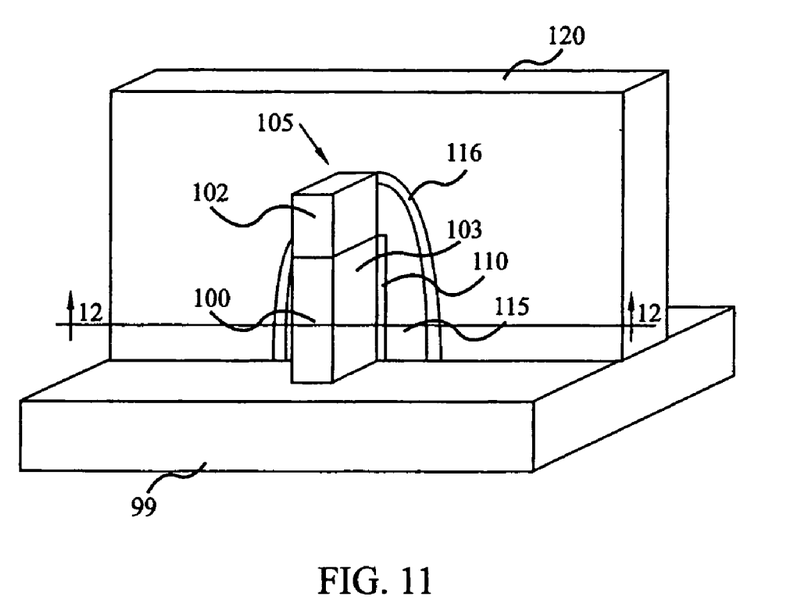

Step 7 of FIG. 1 is the removal of a portion of the floating gate 115 material to expose source and drain regions of fin body 100. Step 7 can be accomplished by a selective etch process or by any means well known in the art. FIG. 11 is a perspective view of the device after the removal of a portion of the floating gate material. As illustrated in FIG. 11, control gate 120 overlies floating gate isolation 116 and oxide shape 102. Below floating gate isolation 116 is floating gate 115. In FIG. 11, Outside the plane of control gate 120, floating gate isolation 116, floating gate 115 and gate oxide 110 have been removed to expose vertical sides of fin stack 105.

As illustrated in FIG. 11, after the selective removal of portions of floating gate to expose source/drain regions of fin body 100, floating gate 15 is present within control gate 120. Floating gate 115 is isolated from control gate 120 by floating gate isolation 116 and oxide shape 102. Floating gate 115 is isolated from the substrate by the BOX 99, and insulated from the silicon which comprises fin body 100 by floating gate insulator layer 110. Therefore, floating gate 115 is electrically isolated from the surrounding structure of the semiconductor device. This electrical isolation defines the floating gate 115. Therefore, once floating gate 115 is charged, by Fowler-Nordheim tunneling or by hot-electron programming or by any other means, because there is no electrical connection between floating gate 115 and other devices and structures, the charge remains in the floating gate, making the FinFET device non-volatile. Floating gate 115 or spacer 115 may act as a capacitor buried in the device.

Step 8 of FIG. 1 is the formation of source/drain implants into exposed regions of Fin stack 105. Turning now to FIG. 11, vertical sides 103 of Fin stack 105 can be implanted to form source/drain regions. Typically, this may include an ion implantation of fin body 100 of Fin stack 105 to form P-well structures and/or N-well structures. In the CMOS technology of the present invention, P-well structures and N-well structures may both be formed to allow the integration of NFETs and PFETs in a common substrate. P, As and Sb, for example, are well suited for PFETs. B, In and Ga, for example, are well suited for NFETs. Ion implantation is typically done to achieve a doping concentration between $1 \times 10^{17}$ cm$^{-3}$ to $5 \times 10^{18}$ cm$^{-3}$ for example. In one embodiment, ion implantation may comprise an angled implant into exposed opposing vertical sidewalls 103 of semiconductor layer 100, and would serve to properly dope the fins.

Step 9 of FIG. 1 illustrates that isolation can also be formed on vertical sides 103 of Fin body 100. Fin stack 105 may be a long line which extends across the semiconductor "chip." Steps 8 and 9 are intended to illustrate steps that may be employed to form FETs on vertical sides 103 of fin body 100 to form FinFETs. Those of ordinary skill in the art will recognize that alternative methods may be employed to form FinFETs. For example, as discussed above, source/drain implants may occur earlier in the fabrication process, at Step 2 of FIG. 1, when fin body 100 is initially formed. Or, gate insulator layer 110 formed at Step 3 of FIG. 1 may remain throughout the process (i.e., may not be removed in Step 7 of FIG. 1) to form the gate insulator layer for the FinFETs.

After the implantation of source/drain regions in vertical sides 103 of semiconductor layer or fin body 100 of fin stack 105 and the formation of isolation on top of the source/drain regions, source/drain regions are surrounded by insulation on four sides: on the bottom by the BOX 99, on the top by the oxide shape 102 and on two vertical surfaces 103 by insulator layer (not shown). Therefore, source/drain regions are insulated on four sides.

Alternatively, source/drain regions can be isolated on three sides. For example, if a non-SOI wafer comprising only wafer 90 (i.e., a chip) is used, source/drain regions will be surrounded by insulation on the top by oxide shape 102 and on two outside vertical surfaces 103 by an insulator layer. In this case, the source/drain regions are isolated on the bottom surface by a P—N junction to a well. In this case, the source/drain regions are surrounded by insulation on three sides.

Providing insulation between the source/drain regions and the substrate (i.e. providing a SOI layer) may create a lower capacitance to the silicon substrate because the dielectric constant of silicon is higher than most dielectrics. In some applications, this lower capacitance, resulting from the presence of insulator on four sides of the source/drain regions may be beneficial. On the other hand, in some applications, the absence of insulator between the source/drain regions and the silicon substrate, resulting from the presence of insulator on three sides (instead of four sides) of the source/drain regions may be desirable.

Those of ordinary skill in the art will also recognize that the fabrication method outlined in FIG. 1 is not the only method for fabricating such a NVRAM FinFET structure. For example, a damascene gate or a replacement gate process may be employed. For this kind of process, a beginning point might be a fin stack 105 or a semiconductor layer or fin body 100 as illustrated in FIG. 11. Instead of building fin gate oxide 110, floating gate 116 and floating gate isolation 116, a block of silicon dioxide could be formed over Fin stack 105, in the dimensions represented by the control gate 120 in FIG. 11. Therefore, instead of the control gate as illustrated in FIG. 11, and underlying structures (including the floating gate isolation 115, floating gate 115, and gate oxide 110) a block of silicon dioxide could be present. Next, the rest of the structure illustrated in FIG. 11 may be filled with silicon nitride level with the silicon dioxide structure. The silicon dioxide structure could then be etched away, creating a hole where the silicon dioxide structure was. Inside the hole would be the fin stack 105. From this structure, the same sequence of fabrication steps as outlined in FIG. 1, steps 3–9 could be employed. The Fin could be implanted, a sacrificial oxide could be formed, the oxide could be stripped, a gate oxide could be formed and floating gate polysilicon could be formed, floating gate isolation could be formed and control gate material could be deposited on the floating gate isolation to form the control gate. After these steps, the silicon nitride could be removed and the exposed fin structures implanted and isolated to form FinFET structures.

Figure 12:
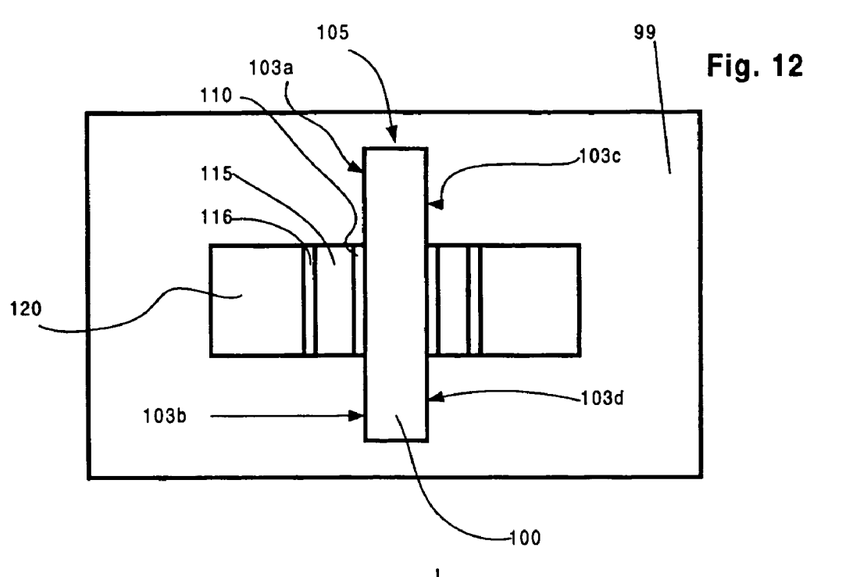
FIG. 12 is a cross-sectional view taken at line 12—12 of FIG. 11.

FIG. 12 is a cross-sectional view taken at line 12—12 of FIG. 11. As illustrated in FIG. 12, exposed Fin stack 105 has four vertical sides, 103a, 103b, 103c and 103d. A FinFET is formed by implanting a source and a drain region about control gate 120. For example, vertical side 103a could be a source and vertical side 103b could be a drain. Control gate 120 controls the movement of charge between the source and the drain through a channel which is fin body 100. Fin body 100 channel may be fully depleted. Floating gate 115 exists adjacent to the FinFET structure to provide NVRAM function. Floating gate 115 is isolated from the FinFET structure by the gate oxide 110, the floating gate isolation 116 and the oxide shape 102 or hard mask on top of the fin body or semiconductor layer 100 (not shown).

Figure 13:
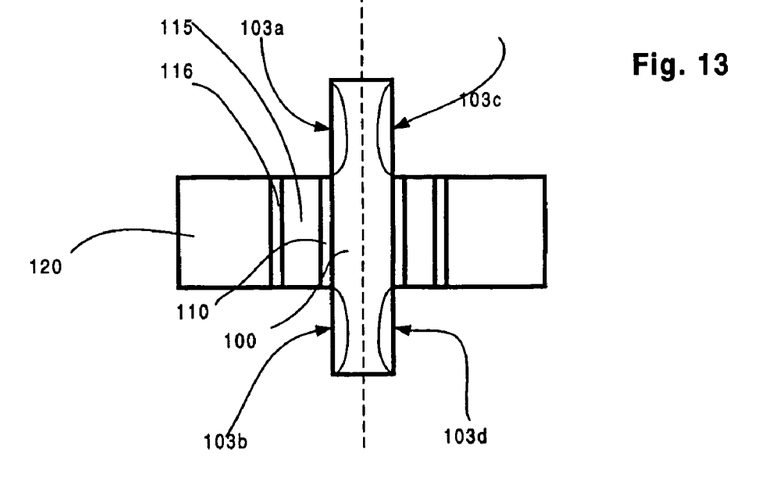
FIG. 13 is a schematic representation of a double gated FinFET with a double floating gate.

FIG. 13 is a schematic representation of a double gate FinFET with double floating gates. A double gate FinFET is illustrated in FIG. 13. To form a double gate FinFET, both sides of Fin stack 105 are implanted to form source/drain regions 103. As illustrated in FIG. 13, vertical sides 103a and 103b may be implanted to form source/drain regions 130 and vertical sides 103c and 103d may be implanted to form source/drain regions 130. Each implanted vertical face, 103a/103b and 103c/103d, together with the control gate 120 and the channel 100 form a transistor or a FinFET. As illustrated in FIG. 13, both vertical sides 103a/103b and 130c/103d are implanted and form a FinFET. Therefore, FIG. 13 illustrates a double gate FinFET or a double control gate. Adjacent to each FinFET is a floating gate 115. Therefore, FIG. 13 illustrates a double gate FinFET with a double floating gate (see also FIG. 11).

The architecture of the FinFETs may affect their performance. For example, a thinner fin body 100 may allow the FinFET to deplete fully when the device is in operation, while a thicker fin body may allow the body of the FinFET to retain some charge in operation. After the FinFETs are formed adjacent to the control gate which contains the floating gate or gates, further processing and fabrication may be employed to complete the device as desired.

Floating gate 115 may be a double floating gate 15 as shown and described in FIGS. 1–13 or may be a single floating gate. In each of these cases, a double-gate controlgate is formed around the entire structure. In the case of a single floating gate, floating gate 115 may be formed on one side or the other of the fin stack 105, but not on both sides, as has been illustrated above. Or, it may be desirable to create an electrical connection between two floating gates 115 in a double floating gate device. Such an electrical connection may be accomplished by forming conductive material in a layer inside the oxide shape 102, forming a metal connection between the two floating gates, or by any other means (See FIG. 8).

For example, an electrical connection between the two floating gates could be accomplished by the following method. Beginning after Step 4 of FIG. 1, after the floating gate material has been deposited and patterned, the oxide shape 102 or hard mask could be selectively etched back to form a recess 200 (See FIG. 6). Then, silicon could be selectively grown on regions of exposed silicon including the polysilicon floating gate spacers 115 and above the recessed hardmask 200. This silicon can be selectively grown to a thickness adequate to bridge the gap between the two floating gate spacers 115 above the recessed Oxide Shape 102 or hard mask. Outdiffusion from floating gate spacers 115 could be sufficient to dope this region of silicon. Alternatively, this selective silicon could be doped with arsenic or other dopants. Then, the method could continue as described in Step 5 of FIG. 1, forming floating gate isolation on the floating gate material. Therefore, the floating gate spacers 115 would have an intergate bridge comprised of doped silicon between them, over a recessed Oxide Shape 102 or hard mask shape. This whole structure could then be covered by dielectric films as in Step 5 of FIG. 1, the control gate material could be deposited as in Step 6 of FIG. 1, the control gate material (Step 7) and portions of the floating gate material could be selectively removed to expose source and drain regions of the fin (Step 8), the source/drain regions could be doped (Step 9) and isolation could be formed on the fin (Step 10).

The FinFETs described herein are transistors which allow for horizontal current flow. Therefore, the FinFETs described herein define charge which flows parallel to the surface of the wafer. While we have described FinFET NVRAM in the context of memory such as FLASH, EEPROM, EPROM and the like, FinFETs with floating gates may provide logic functions. Logic functions might include peripheral support logic functions. For example, an embodiment of the invention may provide row decoders, column decoders, word line drivers, sense amplifiers or bit line drivers.

The embodiments and examples set forth herein were presented in order to best explain the present invention and its practical application and to thereby enable those of ordinary skill in the art to make and use the invention. However, those of ordinary skill in the art will recognize that the foregoing description and examples have been presented for the purposes of illustration and example only. For example, The description as set forth is not intended to be exhaustive or to limit the invention to the precise form disclosed. Many modifications and variations are possible in light of the teachings above without departing from the spirit and scope of the forthcoming claims. Accordingly, unless otherwise specified, any components of the present invention indicated in the drawings or herein are given as an example of possible components and not as a limitation. Similarly, unless otherwise specified, any steps or sequence of steps of the method of the present invention indicated herein are given as examples of possible steps or sequence of steps and not as limitations.

What is claimed is:

1. A method of fabricating a semiconductor device comprising the steps of:
    (a) providing a semiconductor wafer having a buried insulator layer;
    (b) forming a fin on said buried insulator layer of said semiconductor wafer;
    (c) providing a first dielectric on said fin;
    (d) depositing a first conductive material for a floating gate on said first dielectric;
    (e) providing an insulator layer on said first conductive material;
    (f) depositing a second layer of conductive material for a control gate on said insulator layer; and
    (g) patterning said second layer of conductive material and said first conductive material.

2. The method of claim 1 further comprising in step (d) the step of spacer etching said first conductive material to form a spacer floating gate.

3. The method of claim 2 further comprising in step (d) the step of spacer etching said first conductive material to form a double spacer floating gate.

4. The method of claim 2 wherein step (b) further comprises the step of forming a hard mask material on top of said fin to protect said fin where it extends beyond said second conductive material.

5. The method of claim 1 wherein said fin has a sidewall, and further comprising forming a source region that includes a first portion of the sidewall and forming a drain region that includes a second portion of the sidewall.

6. The method of claim 1 wherein the buried insulator layer is a buried oxide layer.

7. The method of claim 6 wherein said buried insulator layer is formed on said semiconductor wafer by using thermal oxidation.

8. The method of claim 1 wherein said fin is formed sufficiently thin as to provide full depletion when the device is in operation.

9. The method of claim 1 wherein the semiconductor device is configured for horizontal current flow.

* * * * *